US 11,769,450 B2

(12) United States Patent
Choi et al.

(10) Patent No.: US 11,769,450 B2
(45) Date of Patent: Sep. 26, 2023

(54) PIXEL CIRCUIT INCLUDING OPTICAL FINGERPRINT SENSING CIRCUIT, METHOD FOR DRIVING PIXEL CIRCUIT, AND ORGANIC LIGHT EMITTING DISPLAY DEVICE

(71) Applicants: LG Display Co., Ltd., Seoul (KR); Industry-University Cooperation Foundation Hanyang University, Seoul (KR)

(72) Inventors: Byong Deok Choi, Seoul (KR); Yong Sang Yoo, Seoul (KR); Yong Duck Kim, Seoul (KR); Jeongmin Moon, Paju-si (KR); Soonshin Jung, Paju-si (KR); Moonbong Song, Paju-si (KR); Jihwan Jung, Paju-si (KR); Kiseok Chang, Paju-si (KR)

(73) Assignees: LG Display Co., Ltd., Seoul (KR); Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 17/297,409

(22) PCT Filed: Jun. 3, 2019

(86) PCT No.: PCT/KR2019/006649
§ 371 (c)(1),
(2) Date: May 26, 2021

(87) PCT Pub. No.: WO2020/141664
PCT Pub. Date: Jul. 9, 2020

(65) Prior Publication Data
US 2022/0012453 A1    Jan. 13, 2022

(30) Foreign Application Priority Data

Dec. 31, 2018  (KR) .................. 10-2018-0173481

(51) Int. Cl.
*G09G 3/3233*    (2016.01)
*G06V 40/13*     (2022.01)
(Continued)

(52) U.S. Cl.
CPC ....... *G09G 3/3233* (2013.01); *G06V 40/1318* (2022.01); *H10K 59/1213* (2023.02);
(Continued)

(58) Field of Classification Search
CPC ......... H04N 5/374–379; H01L 27/3225–3234; H01L 27/3227; H01L 27/3262;
(Continued)

(56) References Cited

U.S. PATENT DOCUMENTS 9,501,686 B2    11/2016   Zhao et al.
9,984,272 B2    5/2018    Yang et al.
(Continued)

FOREIGN PATENT DOCUMENTS

KR    10-2015-0089476 A    8/2015
KR    10-1560417 B1        10/2015
KR    10-2018-0117748 A    10/2018

OTHER PUBLICATIONS

PCT International Search Report, PCT/KR2019/006649, dated Sep. 30, 2019, 4 Pages.

*Primary Examiner* — Roberto W Flores
(74) *Attorney, Agent, or Firm* — Fenwick & West LLP

(57) ABSTRACT

The present disclosure relates to a pixel circuit including an optical fingerprint sensing circuit, a method for driving a pixel circuit including the optical fingerprint sensing circuit, and a display device including the pixel circuit including the optical fingerprint sensing circuit. The pixel circuit includes: a self-light emitting element which displays images by a driving current controlled by a driving transistor; and a light-receiving element which receives light emitted from
(Continued)

the self-light emitting element and reflected through a fingerprint of a user and converts it into a photocurrent. The driving transistor functions as a buffer which transmits an output voltage of the light-receiving element to an output line of the pixel circuit.

8 Claims, 10 Drawing Sheets

(51) Int. Cl.
  *H10K 59/60* (2023.01)
  *H10K 59/131* (2023.01)
  *H10K 59/121* (2023.01)
(52) U.S. Cl.
  CPC ....... *H10K 59/1216* (2023.02); *H10K 59/131* (2023.02); *H10K 59/60* (2023.02); *G09G 2310/0291* (2013.01)
(58) Field of Classification Search
  CPC ............. H01L 27/3265; H01L 27/3276; G06F 3/0412; G06F 3/042–0428; G06V 40/1318; G09G 3/3233; G09G 2310/0291; G09G 2300/0819; G09G 2300/0842; G09G 2300/0861; G09G 2310/0251; G09G 2310/0262; G09G 2360/148; G09G 3/32–3291; G09G 3/30–3291; G06K 9/00; H10K 59/40–65
  See application file for complete search history.

(56) References Cited

U.S. PATENT DOCUMENTS

| | | | |
|---|---|---|---|
| 2007/0046593 A1* | 3/2007 | Shin | G09G 3/3233 345/81 |
| 2009/0201230 A1* | 8/2009 | Smith | G09G 3/3283 345/76 |
| 2010/0149079 A1* | 6/2010 | Yamashita | G09G 3/3233 345/87 |
| 2010/0177075 A1* | 7/2010 | Fish | G09G 3/2014 345/207 |
| 2015/0369961 A1 | 12/2015 | Alli et al. | |
| 2016/0062522 A1* | 3/2016 | Yang | G06F 3/042 345/174 |
| 2016/0225829 A1* | 8/2016 | Wu | G06F 3/04164 |
| 2016/0253541 A1 | 9/2016 | Yang et al. | |
| 2017/0220839 A1* | 8/2017 | Yang | H01L 27/3234 |
| 2019/0279566 A1* | 9/2019 | Wang | G06V 40/1376 |
| 2020/0335035 A1* | 10/2020 | Gai | G09G 3/3233 |
| 2021/0335249 A1* | 10/2021 | Zhang | G09G 3/3291 |
| 2021/0366394 A1* | 11/2021 | Gai | G09G 3/3266 |
| 2021/0374378 A1* | 12/2021 | Kobayashi | H04N 5/374 |

* cited by examiner

PIXEL CIRCUIT INCLUDING OPTICAL FINGERPRINT SENSING CIRCUIT, METHOD FOR DRIVING PIXEL CIRCUIT, AND ORGANIC LIGHT EMITTING DISPLAY DEVICE

FIELD

The present disclosure relates to a pixel circuit including an optical fingerprint sensing circuit, a method for driving a pixel circuit including the optical fingerprint sensing circuit, and a display device including the pixel circuit including the optical fingerprint sensing circuit.

The present application is a 35 U.S.C 371 Patent Application of PCT Application No. PCT/KR2019/006649, filed on Jun. 3, 2019 which claims the benefit of priority to Korean Patent Application No. 10-2018-0173481, filed on Dec. 31, 2018, each of which is incorporated herein by reference

DESCRIPTION OF THE RELATED ART

An image display device is currently being used in computer-based systems such as a laptop computer, a tablet PC, a smart phone, a personal digital assistant (PDA), an automated teller machine, and a search guidance system. These systems store usually not only personal information related to personal privacy but also a lot of confidential data such as business information or trade secret. There is a necessity of enhancing security in order to protect these data.

A fingerprint can be used as a way to enhance security. As a fingerprint of a finger is used in the computer-based systems, active research is being devoted to an image display device including a finger identification device, which is expected to be widely used in smart phones.

In general, the image display device including a fingerprint sensing circuit identifies fingerprints in an optical sensing manner or a capacitive manner.

An image display device that identifies a fingerprint in an optical sensing manner is provided with a fingerprint identification circuit including a light-receiving element as a fingerprint sensor on a display panel. The light-receiving element senses light emitted from the display panel and reflected by the fingerprint and generates a photocurrent. Here, the amount of photocurrent generated from the light-receiving element varies depending on whether the object reflecting the light is a ridge or a valley of the fingerprint. The fingerprint identification circuit identifies the form of the fingerprint through the amount of change in the photocurrent.

SUMMARY

Technical Problem

In order to identify a fingerprint in an optical sensing manner, a fingerprint identification circuit having, for example, a high resolution of 500 PPI or higher is required.

The inventors of the present invention have recognized that there is a problem in making the fingerprint sensing circuit to have a resolution of 500 PPI or higher due to the area occupied by the pixel circuit of the image display device.

The present disclosure is designed to address the above-described problem and provides a pixel circuit having a fingerprint sensing function capable of reducing the area of a circuit to be integrated within a display panel by adding one light-receiving element to the pixel circuit and by allowing the optical fingerprint sensing circuit and the pixel circuit to share a driving transistor or a threshold voltage Vth compensation transistor.

Technical Solution

The present disclosure has the following characteristics for the purpose of solving the above-described technical problem.

One embodiment is a pixel circuit sharing elements with a finger sensing circuit. The pixel circuit includes: a self-light emitting element which displays images by a transistor; and a light-receiving element which receives light emitted from the self-light emitting element and reflected through a fingerprint of a user and converts it into an electrical signal. The pixel circuit reads, through an output line of the pixel circuit, an output signal generated through the light-receiving element.

The element that the pixel circuit shares with the fingerprint sensing circuit is any one of a driving transistor, a compensation transistor, and a switch transistor.

The driving transistor drives the self-light emitting element and functions as a buffer which transmits an output voltage of the light-receiving element to the output line of the pixel circuit.

The compensation transistor compensates at least one of a threshold voltage VTH, mobility, and a VDD voltage of the driving transistor.

Also, the pixel circuit includes a first transistor, a second transistor functioning as the driving transistor, a third transistor functioning as the compensation transistor, a fourth transistor, a fifth transistor, and a sixth transistor. A first terminal of the first transistor is connected to a data line. A second terminal of the first transistor is connected to a first node. A gate terminal of the first transistor is connected to an n-th scan line. A first terminal of the second transistor is connected to the first node. A second terminal of the second transistor is connected to a second node. A gate terminal of the second transistor is connected to a third node. A first terminal of the third transistor is connected to the third node. A second terminal of the third transistor is connected to the second node. A gate terminal of the third transistor is connected to the n-th scan line. A first terminal of the fourth transistor is connected to the third node. A second terminal of the fourth transistor is connected to a cathode terminal of the light-receiving element. A gate terminal of the fourth transistor is connected to a first sensing line. A first terminal of the fifth transistor is connected to the second node. A second terminal of the fifth transistor is grounded. A gate terminal of the fifth transistor is connected to the first sensing line. A first terminal of the sixth transistor is connected to the first node. A second terminal of the sixth transistor is connected to an output node. A gate terminal of the sixth transistor is connected to a second sensing line.

Also, the pixel circuit further includes a seventh transistor, an eighth transistor, a ninth transistor, a tenth transistor, and a capacitor. A first terminal of the seventh transistor is connected to an initialization line. A second terminal of the seventh transistor is connected to the third node. A gate terminal of the seventh transistor is connected to an (n−1)-th scan line. A first terminal of the eighth transistor is connected to the initialization line. A second terminal of the eighth transistor is connected to an anode terminal of the self-light emitting element. A gate terminal of the eighth transistor is connected to the (n−1)-th scan line. A first terminal of the ninth transistor is connected to a power supply VDD. A second terminal of the ninth transistor is connected to the first node. A gate terminal of the ninth transistor is connected to an emission line. A first terminal of the tenth transistor is connected to the second node. A second terminal of the tenth transistor is connected to the anode terminal of the self-light emitting element. A gate terminal of the tenth transistor is connected to the emission line. A first terminal of the capacitor is connected to the power supply. A second terminal of the capacitor is connected to the third node. A cathode terminal of the self-light emitting element and an anode terminal of the light-receiving element are grounded.

In the present disclosure, on the basis of an (n−1)-th scan signal of the (n−1)-th scan line and an initialization signal of the initialization line, the seventh transistor and the eighth transistor reset a data of a previous frame. On the basis of an n-th scan signal of the n-th scan line, the first transistor applies a data signal to the first node. The third transistor compensates a threshold voltage Vth of the second transistor. On the basis of a first sensing signal of the first sensing line and a current due to the light-receiving element, the fourth transistor applies a voltage to the third node, and the voltage applied to the third node is transmitted to the first node by a source follower operation of the second transistor. On the basis of a second sensing signal of the second sensing line, the sixth transistor outputs the voltage of the first node to the output line.

Also, the light-receiving element generates a current by receiving light output from the self-light emitting element, applies a voltage to the third node on the basis of the first sensing signal of the first sensing line and the generated current, and transmits the voltage applied to the third node to the first node by the source follower operation of the second transistor. On the basis of the second sensing signal of the second sensing line, the sixth transistor outputs the voltage of the first voltage to the output line.

The present disclosure relates to a pixel circuit having a lifetime compensation function of a self-light emitting element. The pixel circuit includes the self-light emitting element which displays images by a driving current controlled by a driving transistor; and a light-receiving element which receives light emitted from the self-light emitting element and converts it into a photocurrent. The driving transistor functions as a buffer which transmits an output voltage of the light-receiving element to an output line of the pixel circuit. The pixel circuit converts the voltage output to the output line from an analog signal into a digital signal, compares the digital signal with brightness data of the self-light emitting element, obtains a lifetime of the self-light emitting element on the basis of the comparison result, and compensates a voltage to be applied to the driving transistor on the basis of the comparison result.

Also, the pixel circuit includes a first transistor, a second transistor functioning as the driving transistor, a third transistor functioning as the compensation transistor, a fourth transistor, a fifth transistor, a sixth transistor, a first capacitor, and a second capacitor. A first terminal of the first transistor is connected to a data line. A second terminal of the first transistor is connected to a first node. A gate terminal of the first transistor is connected to an n-th scan line. A first terminal of the second transistor is connected to a second node. A second terminal of the second transistor is connected to a third node. A gate terminal of the second transistor is connected to a fourth node. A first terminal of the third transistor is connected to the fourth node. A second terminal of the third transistor is connected to the third node. A gate terminal of the third transistor is connected to an (n−1)-th scan line. A first terminal of the fourth transistor is connected to the first node. A second terminal of the fourth transistor is connected to a cathode terminal of the light-receiving element. A gate terminal of the fourth transistor is connected to a first sensing line. A first terminal of the fifth transistor is connected to the third node. A second terminal of the fifth transistor is grounded. A gate terminal of the fifth transistor is connected to the first sensing line. A first terminal of the sixth transistor is connected to the second node. A second terminal of the sixth transistor is connected to an output node. A gate terminal of the sixth transistor is connected to a second sensing line. A first terminal of the first capacitor is connected to the first node. A second terminal of the first capacitor is connected to the fourth node. A first terminal of the second capacitor is connected to the first node. A second terminal of the second capacitor is grounded.

Also, the pixel circuit further includes a seventh transistor, an eighth transistor, and a ninth transistor. A first terminal of the seventh transistor is connected to a power supply VDD. A second terminal of the seventh transistor is connected to the first node. A gate terminal of the seventh transistor is connected to the (n−1)-th scan line. A first terminal of the eighth transistor is connected to the power supply. A second terminal of the eighth transistor is connected to the second node. A gate terminal of the eighth transistor is connected to a first emission line. A first terminal of the ninth transistor is connected to the third node. A second terminal of the ninth transistor is connected to an anode terminal of the self-light emitting element. A gate terminal of the ninth transistor is connected to a second emission line. A cathode terminal of the self-light emitting element and an anode terminal of the light-receiving element are grounded.

Also, the pixel circuit includes a first transistor, a second transistor functioning as the driving transistor, a third transistor, a fourth transistor, and a fifth transistor. A first terminal of the first transistor is connected to a data line. A second terminal of the first transistor is connected to a first node. A gate terminal of the first transistor is connected to an n-th scan line. A first terminal of the second transistor is connected to a second node. A second terminal of the second transistor is connected to a third node. A gate terminal of the second transistor is connected to the first node. A first terminal of the third transistor is connected to the first node. A second terminal of the third transistor is connected to a cathode terminal of the light-receiving element. A gate terminal of the third transistor is connected to a first sensing line. A first terminal of the fourth transistor is connected to the third node. A second terminal of the fourth transistor is grounded. A gate terminal of the fourth transistor is connected to the first sensing line. A first terminal of the fifth transistor is connected to the second node. A second terminal of the fifth transistor is connected to an output node. A gate terminal of the fifth transistor is connected to a second sensing line.

Also, the pixel circuit further includes a sixth transistor and a capacitor. A first terminal of the sixth transistor is connected to a power supply VDD. A second terminal of the sixth transistor is connected to the second node. A gate terminal of the sixth transistor is connected to an emission line. A first terminal of the capacitor is connected to the power supply. A second terminal of the capacitor is connected to the first node. An anode terminal of the self-light emitting element is connected to the third node. A cathode terminal of the self-light emitting element is grounded. An anode terminal of the light-receiving element is grounded.

Advantageous Effects

The present disclosure provides a pixel circuit with a fingerprint sensing function by adding one light-receiving element to the pixel circuit and by allowing the optical fingerprint sensing circuit and the pixel circuit to share a driving transistor or a threshold voltage Vth compensation transistor. Therefore, the area of the circuit to be integrated within the display panel can be reduced.

Also, in the present disclosure, the pixel circuit compensates, on the basis of the amount of light measured by the light-receiving element, the voltage applied to the self-light emitting element, thereby preventing a decrease in luminance of the self-light emitting element according to the time of use and thereby extending the lifetime of the self-light emitting element.

DETAILED DESCRIPTION

Figure 1:
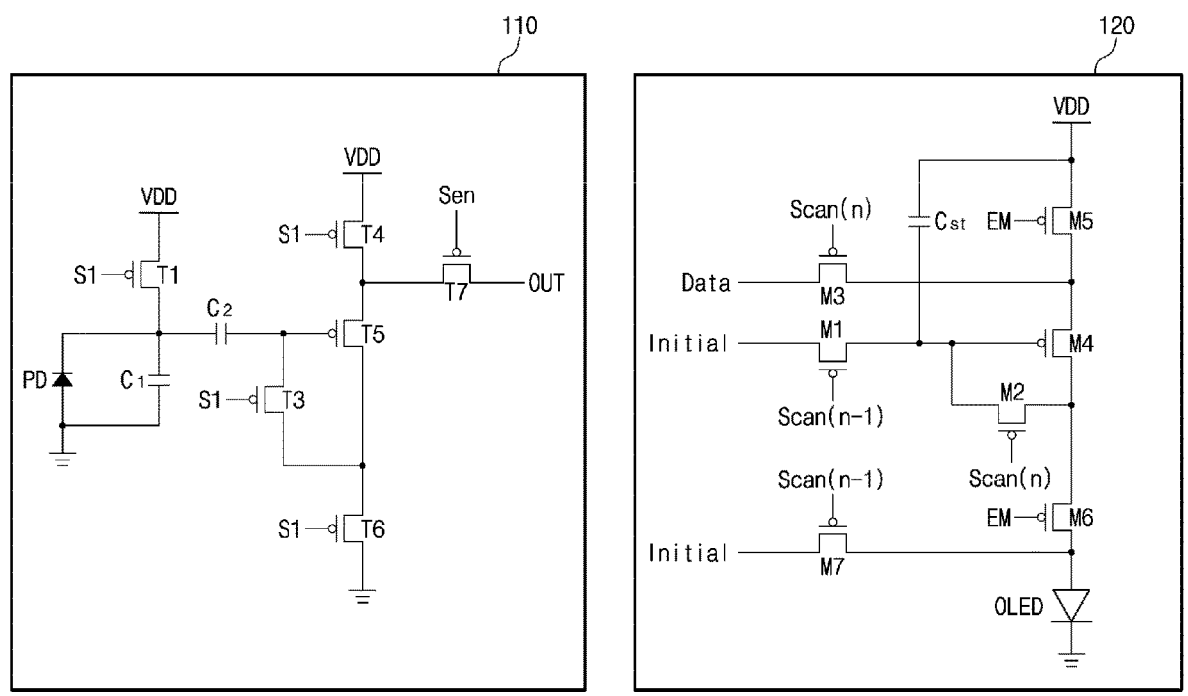
FIG. 1 shows a pixel circuit and a fingerprint sensing circuit according to a prior art.

The features, advantages and method for accomplishment of the disclosed embodiment will be more apparent from referring to the following embodiments described as well as the accompanying drawings. However, the present disclosure is not limited to the embodiment to be disclosed below and can be implemented in different and various forms. The embodiments bring about the complete disclosure of the present invention and are only provided to make those skilled in the art fully understand the scope of the present invention.

According to the embodiment of the present disclosure, a "part" can be implemented as a processor and/or a memory. The term "processor" is to be construed broadly to include general purpose processors, central processing units (CPUs), microprocessors, digital signal processors (DSPs), controllers, microcontrollers, state machines, and the like. In some circumstances, a "processor" may refer to an application specific integrated circuit (ASIC), programmable logic device (PLD), field programmable gate array (FPGA), and the like. The term "processor" refers to a combination of processing devices, for example, a combination of the DSP and the microprocessor, a combination of a plurality of microprocessors, a combination of one or more microprocessors combined with a DSP core, or a combination of any other such configurations.

The term "memory" should be construed broadly to include any electronic component capable of storing electronic information. The term memory refers to various types of processor-readable media such as random-access memory (RAM), read-only memory (ROM), non-volatile random-access memory (NVRAM), programmable read-only memory (PROM), erase-programmable read-only memory (EPROM), electrically erasable PROM (EEPROM), flash memory, magnetic or optical data storage, registers, and the like. The memory is said to be in electronic communication with the processor if the processor is able to read information from the memory and/or to write information to the memory. The memory integrated in the processor is in electronic communication with the processor.

Hereinafter, embodiments will be described in detail with reference to the accompanying drawings such that that those of ordinary skill in the art can easily implement the embodiments. Also, in the drawings, parts irrelevant to the description may be omitted in order to clearly describe the present disclosure.

FIG. 1 shows a pixel circuit and a fingerprint sensing circuit according to a prior art.

In order to identify a fingerprint in an optical sensing manner, a fingerprint identification circuit having a resolution of 500 PPI or higher is required. Referring to FIG. 1, a conventional self-light emitting element display device includes a fingerprint sensing circuit 110 and a pixel circuit 120, respectively. However, due to the area occupied by the pixel circuit 120 of the self-light emitting element display device, it is difficult to make the fingerprint sensing circuit 110 have a resolution of 500 PPI or higher.

The self-light emitting element may include an electroluminescence element, an OLED, a quantum dot-LED (QD-LED), a Micro-LED, and the like.

Embodiment 1

Figure 2:
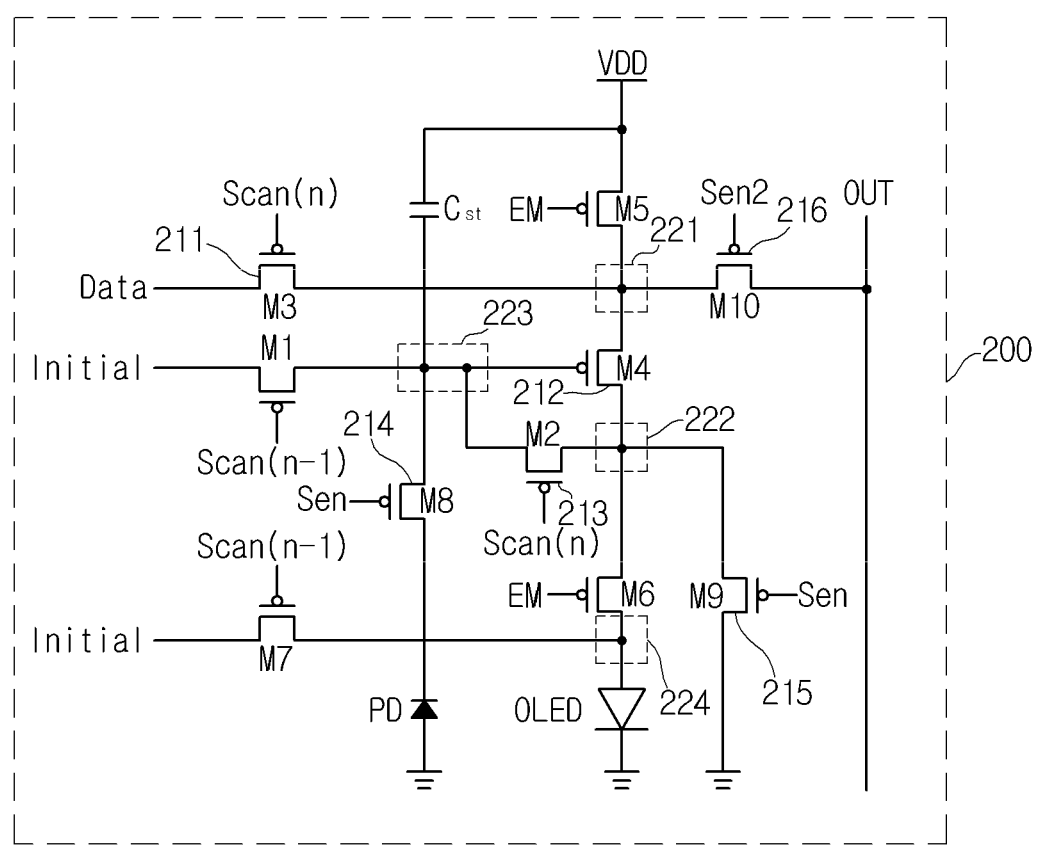
FIG. 2 shows a pixel circuit according to an embodiment of the present disclosure.

FIG. 2 shows a pixel circuit according to an embodiment of the present disclosure.

A pixel circuit 200 according to the embodiment of the present disclosure may share an optical fingerprint sensing circuit and a transistor. Specifically, the pixel circuit 200 may share a second transistor (M4) 212 and a third transistor (M2) 213. The second transistor (M4) 212 functions as an optical fingerprint sensing circuit and a driving transistor. The third transistor (M2) 213 function as a compensation transistor which compensates at least one of a threshold voltage Vth, mobility, and a VDD voltage of the second transistor. The optical fingerprint sensing circuit and the pixel circuit share the driving transistor and the compensation transistor, thereby reducing the number of elements and reducing the area of the circuit to be integrated within a display panel.

The pixel circuit 200 including the optical fingerprint sensing circuit may include a first transistor (M3) 211, the second transistor (M4) 212, the third transistor (M2) 213, and a fourth transistor (M8) 214, a fifth transistor (M9) 215 and a sixth transistor (M10) 216.

The first transistor 211, the second transistor 212, the third transistor 213, the fourth transistor 214, the fifth transistor 215, and the sixth transistor 216 may include a first terminal, a second terminal, and a gate terminal. The first terminal or the second terminal may be a source terminal or a drain terminal. The first transistor 211, the second transistor 212, the third transistor 213, the fourth transistor 214, the fifth transistor 215, and the sixth transistor 216 may be turned-on or turned-off according to a signal of the gate terminal.

The first terminal of the first transistor 211 is connected to a data line Data. The second terminal of the first transistor 211 is connected to a first node 221. The gate terminal of the first transistor 211 is connected to an n-th scan line Scan(n).

The first terminal of the second transistor 212 is connected to the first node 221. The second terminal of the second transistor 212 is connected to a second node 222. The gate terminal of the second transistor 212 is connected to a third node 223.

The first terminal of the third transistor 213 is connected to the third node 223. The second terminal of the third transistor 213 is connected to the second node 222. The gate terminal of the third transistor 213 is connected to the n-th scan line Scan(n).

The first terminal of the fourth transistor 214 is connected to the third node 223. The second terminal of the fourth transistor 214 is connected to a cathode terminal of a light-receiving element PD. The gate terminal of the fourth transistor 214 is connected to a first sensing line Sen.

The light-receiving element PD receives light emitted from a self-light emitting element and reflected from a finger of a user and converts it into a photocurrent. The light-receiving element PD may be, for example, a photodiode. In this case, the amount of photocurrent generated from the light-receiving element PD varies depending on whether the object reflecting the light is a ridge or a valley of the fingerprint. Here, a first photocurrent due to the light reflected from the valley may be greater than a second photocurrent due to the light reflected from the ridge. However, the present invention is not limited thereto, and the first photocurrent may be less than or equal to the second photocurrent.

The first terminal of the fifth transistor 215 is connected to the second node 222. The second terminal of the fifth transistor 215 is grounded. The gate terminal of the fifth transistor 215 is connected to the first sensing line Sen.

The first terminal of the sixth transistor 216 is connected to the first node 221. The second terminal of the sixth transistor 216 is connected to an output line OUT. The gate terminal of the sixth transistor 216 is connected to a second sensing line Sen2.

Also, the pixel circuit 200 may further include a seventh transistor M1, an eighth transistor M7, a ninth transistor M5, a tenth transistor M6, a capacitor CST, and a self-light emitting element.

A first terminal of the seventh transistor M1 may be connected to an initialization line Initial. A second terminal of the seventh transistor M1 may be connected to the third node 223. A gate terminal of the seventh transistor M1 may be connected to an (n−1)-th scan line Scan(n−1).

A first terminal of the eighth transistor M7 may be connected to the initialization line Initial. A second terminal of the eighth transistor M7 may be connected to an anode terminal of the self-light emitting element. A gate terminal of the eighth transistor M7 may be connected to the (n−1)-th scan line Scan(n−1).

A first terminal of the ninth transistor M5 may be connected to a power supply VDD. A second terminal of the ninth transistor M5 may be connected to the first node 221. A gate terminal of the ninth transistor M5 may be connected to an emission line EM.

A first terminal of the tenth transistor M6 may be connected to the second node 222. A second terminal of the tenth transistor M6 may be connected to the anode terminal of the self-light emitting element. A gate terminal of the tenth transistor M6 may be connected to the emission line EM.

A first terminal of the capacitor may be connected to the power supply VDD. A second terminal of the capacitor may be connected to the third node 223. The capacitor may be a storage capacitor. The capacitor may uniformly maintain a difference voltage between a voltage according to the current of the light-receiving element applied to the second terminal and a voltage applied to the power supply VDD.

A cathode terminal of the self-light emitting element and an anode terminal of the light-receiving element may be grounded.

Referring back to FIG. 1, the fingerprint sensing circuit 110 according to the prior art includes seven transistors and two capacitors. Also, the pixel circuit 120 according to the prior art includes seven transistors and one capacitor. That is, the fingerprint sensing circuit 110 and the pixel circuit 120 according to the prior art may include a total of 14 transistors and three capacitors. In contrast, the present disclosure includes, as shown in FIG. 2, 10 transistors and one capacitor. That is, in the present disclosure, the number of elements constituting the circuit is smaller and the area occupied by the pixel circuit can be reduced compared to the prior art. Accordingly, the pixel circuit according to the embodiment of the present disclosure is able to display images with high resolution and to accurately identify fingerprints.

The self-light emitting element emits light according to the data current introduced by the turn-on of the tenth transistor M6. To this end, the self-light emitting element includes an organic light-emitting cell formed between the anode terminal and the cathode terminal. Here, the organic light-emitting cell may be formed to have a structure of a hole transport layer/organic light-emitting layer/electron transport layer or a structure of a hole injection layer/hole transport layer/organic light-emitting layer/electron transport layer/electron injection layer. Also, a functional layer for improving the light emission efficiency and/or lifetime of the organic light-emitting layer may be additionally formed in the organic light-emitting cell.

The pixel circuit 200 may receive an initialization signal from the initialization line Initial. The pixel circuit may obtain a data signal from the data line Data. The pixel circuit may receive an emission signal from the emission line EM. The pixel circuit may receive an n-th scan signal from the n-th scan line. The pixel circuit may receive an (n−1)-th scan signal from the (n−1)-th scan line. "n" may be a positive integer. "n" may represent a frame of an image to be displayed in the pixel circuit. For example, the n-th scan signal may be a scan signal for an n-th frame.

A system including the pixel circuit 200 may cause the self-light emitting element to emit light by manipulating at least one of the n-th scan signal, the (n−1)-th scan signal, the initialization signal, the data signal, and the emission signal. The system may include a processor or a memory. The processor may manipulate at least one of the n-th scan signal, the (n−1)-th scan signal, the initialization signal, the data signal, and the emission signal in accordance with instructions or data included in the memory. Hereinafter, a fingerprint identification method of the pixel circuit will be described.

Figure 3:
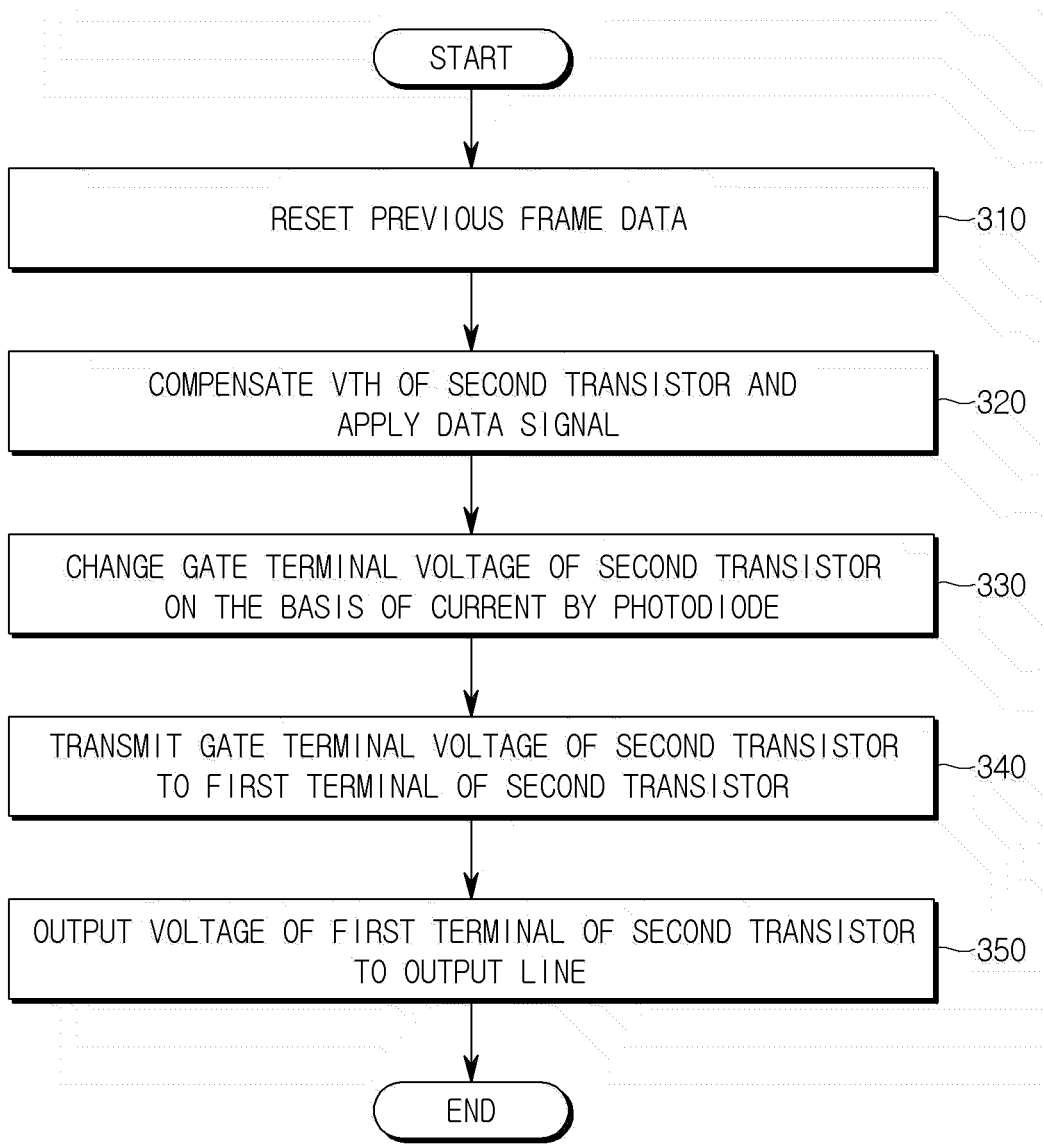
FIG. 3 is a flowchart showing a fingerprint identification method of the pixel circuit according to the embodiment of the present disclosure.

FIG. 3 is a flowchart showing a fingerprint identification method of the pixel circuit according to the embodiment of the present disclosure.

The system including the pixel circuit 200 may perform steps 310 to 350 of FIG. 3 by manipulating at least one of the n-th scan signal, the (n−1)-th scan signal, the initialization signal, the data signal, the emission signal, a first sensing signal, and a second sensing signal.

The system including the pixel circuit 200 may perform resetting a previous frame data (310). The system including the pixel circuit 200 may compensate the threshold voltage Vth of the second transistor on the basis of at least one of the data signal and the n-th scan signal, and may perform applying the data signal (320). The system including the pixel circuit 200 may perform changing a gate terminal voltage of the second transistor on the basis of the current by the light-receiving element (330). The system including the pixel circuit 200 may perform transmitting the gate terminal voltage of the second transistor to the first terminal of the second transistor through a source follower operation (340). The system including the pixel circuit 200 may perform outputting the voltage of the first terminal of the second transistor to the output line (350).

Each step of FIG. 3 will be described in more detail together with FIGS. 4 to 7.

Figure 4:
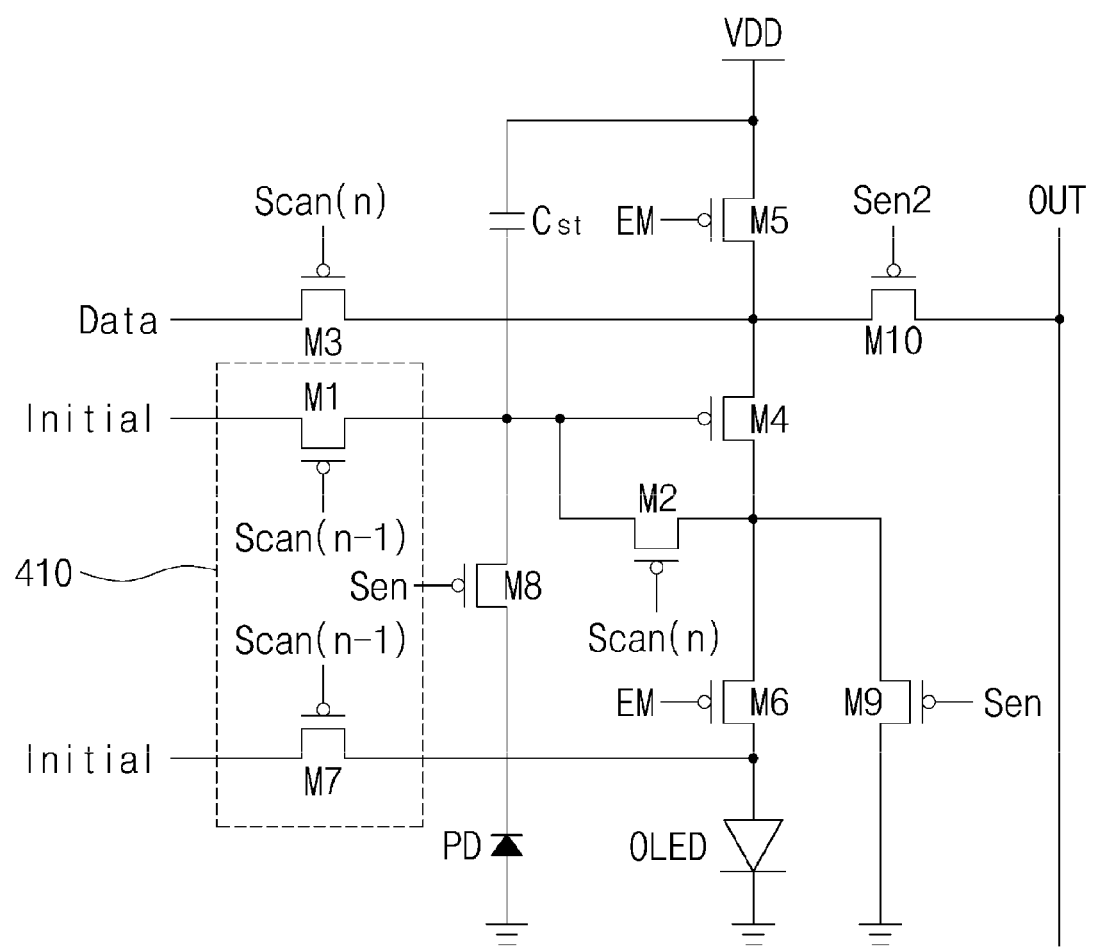
FIG. 4 is a circuit diagram for describing the operation of the pixel circuit according to the embodiment of the present disclosure.

FIG. 4 is a circuit diagram for describing the operation of the pixel circuit according to the embodiment of the present disclosure.

Step 310

The system including the pixel circuit 200 may perform an initialization phase. The system including the pixel circuit 200 may perform resetting a previous frame data (310). In step 310, the seventh transistor and the eighth transistor 410 may operate. The system may transmit at least one of the (n−1)-th scan signal and the initialization signal to the pixel circuit 200. The pixel circuit 200 may receive the (n−1)-th scan signal from the (n−1)-th scan line Scan(n−1). The pixel circuit 200 may receive the initialization signal from the initialization line Initial. Based on the (n−1)-th scan signal and the initialization signal, the seventh transistor M1 and the eighth transistor M7 may reset the previous frame data.

Figure 5:
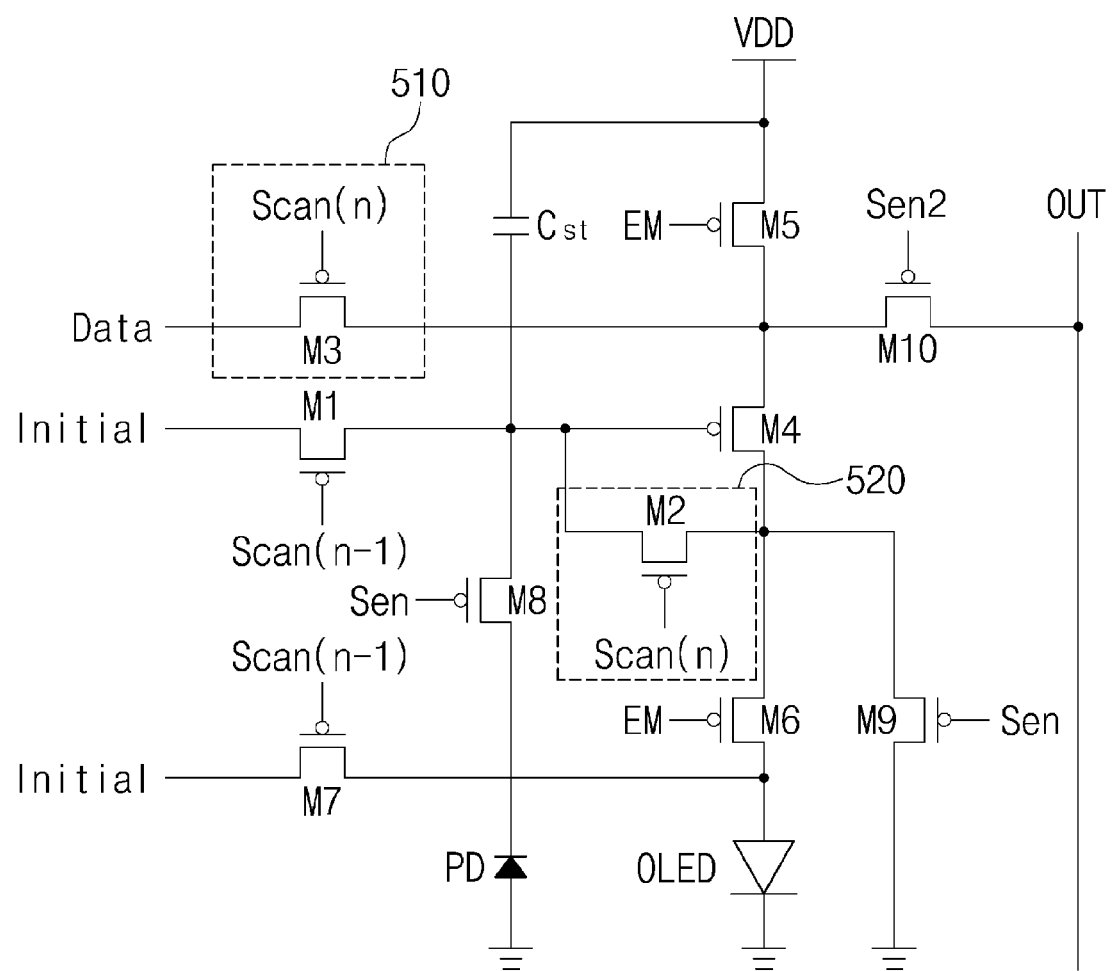
FIG. 5 is a circuit diagram for describing the operation of the pixel circuit according to the embodiment of the present disclosure.

FIG. 5 is a circuit diagram for describing the operation of the pixel circuit according to the embodiment of the present disclosure.

Step 320

The system including the pixel circuit 200 may perform a threshold voltage compensation phase. The system including the pixel circuit 200 may compensate the threshold voltage Vth of the second transistor and perform applying the data signal (320). In step 320, the first transistor (M3) 510 and the third transistor (M2) 520 may operate. The system may transmit at least one of the n-th scan signal and the data signal to the pixel circuit 200. The pixel circuit 200 may receive the n-th scan signal from the n-th scan line Scan(n). The pixel circuit 200 may receive the data signal from the data line Data. Based on the n-th scan signal, the first transistor 510 may apply the data signal to the first node 221. Based on the n-th scan signal, the third transistor 520 may compensate the threshold voltage Vth of the second transistor M4.

Figure 6:
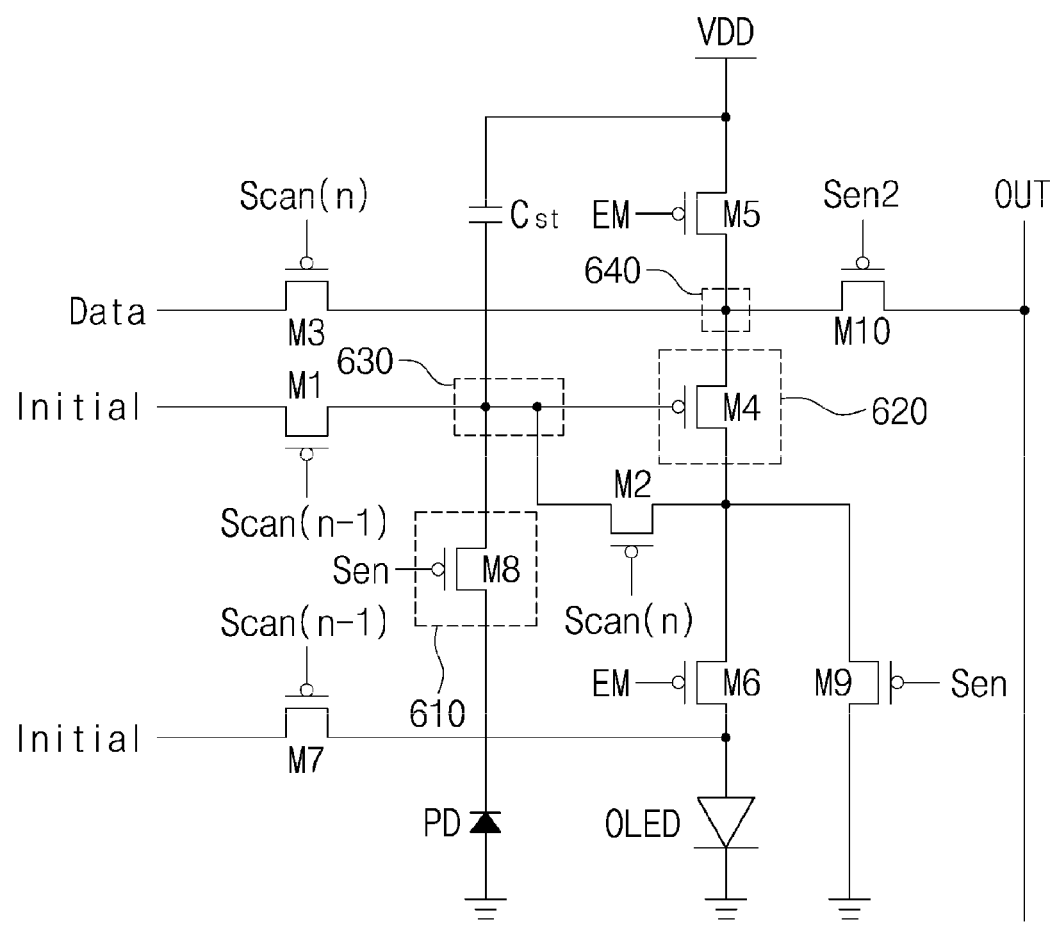
FIG. 6 is a circuit diagram for describing the operation of the pixel circuit according to the embodiment of the present disclosure.

FIG. 6 is a circuit diagram for describing the operation of the pixel circuit according to the embodiment of the present disclosure.

Steps 330 and 340

The system including the pixel circuit 200 may perform an integration phase. The integration phase may include changing the gate terminal voltage of the second transistor on the basis of the current by the light-receiving element (330). The integration phase may include transmitting the gate terminal voltage of the second transistor to the first terminal of the second transistor through a source follower operation (340).

In step 330, a fourth transistor 610 may operate. The system including the pixel circuit 200 may transmit the first sensing signal to the pixel circuit 200. The pixel circuit 200 may receive the first sensing signal from the first sensing line Sen. The light-receiving element PD may generate a current according to the amount of received light. Based on the current by the first sensing signal and the light-receiving element PD, the fourth transistor 610 may apply a voltage to a third node 630.

In step 340, a second transistor 620 may operate. The voltage applied to the third node 630 by the source follower operation of the second transistor 620 may be transmitted to a first node 640. Here, the photocurrent generated by the light-receiving element which has received the light reflected by the fingerprint is integrated for several frames. Specifically, the fourth transistor 610 operates and converts the photocurrent converted by the light-receiving element into a voltage and applies to the third node 630. The second transistor 620 operates and transmits the voltage of the third node 630 to the first node 610. That is, the second transistor 620 functions as a source follower, i.e., a buffer.

Figure 7:
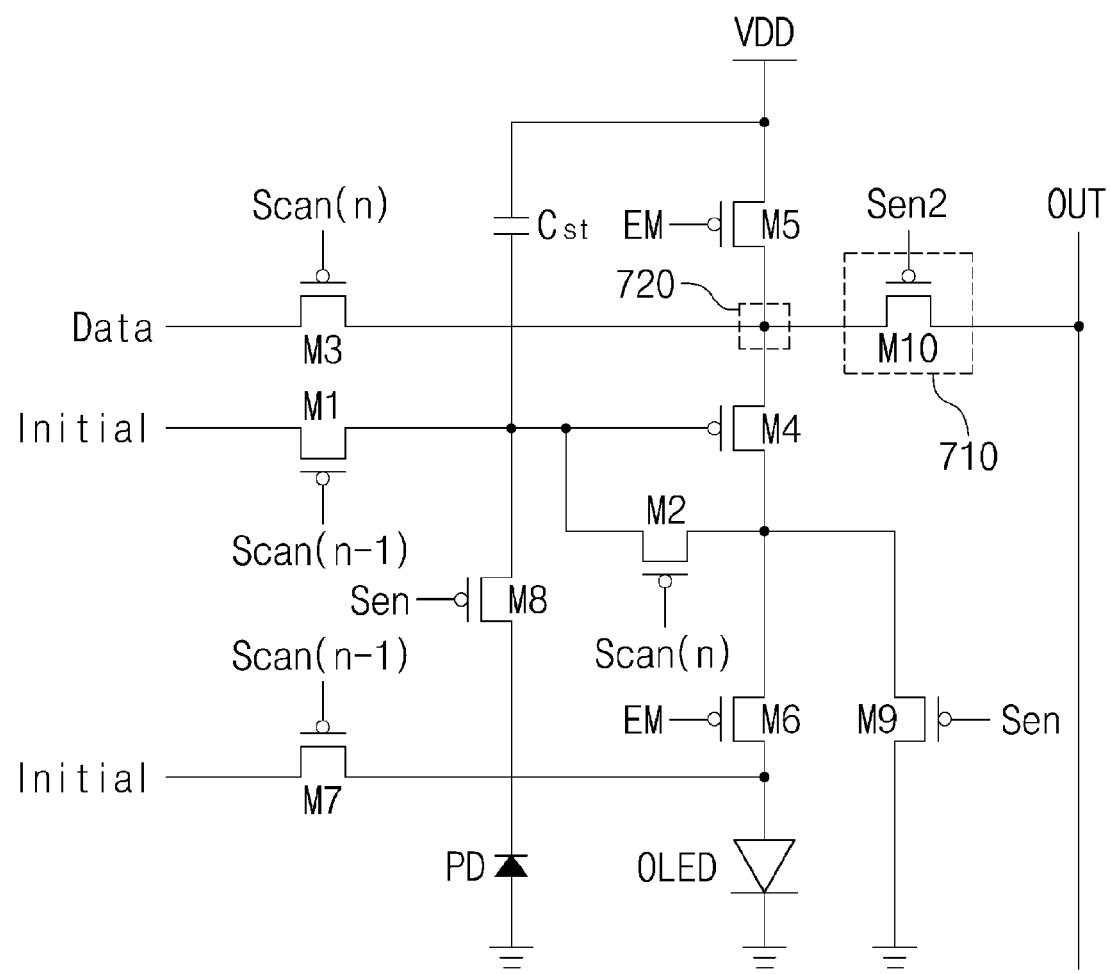
FIG. 7 is a circuit diagram for describing the operation of the pixel circuit according to the embodiment of the present disclosure.

FIG. 7 is a circuit diagram for describing the operation of the pixel circuit according to the embodiment of the present disclosure.

Step 350

The system including the pixel circuit 200 may perform a sense phase. The system including the pixel circuit 200 may perform outputting the voltage of the first terminal of the second transistor to the output line (350). In step 350, a sixth transistor 710 may operate. The system may transmit the second sensing signal to the pixel circuit 200. The pixel circuit 200 may receive the second sensing signal from the second sensing line Sen2. Based on the second sensing signal, the sixth transistor 710 may output a voltage of a first node 720 to the output line OUT. The system may receive the output of the pixel circuit 200 as data. Also, the system may identify fingerprints on the basis of data received from a plurality of pixel circuits.

Hereinafter, FIG. 8 will be described together with the pixel circuit 200 of FIG. 2.

The pixel circuit of the present disclosure may include the light-receiving element PD and the self-light emitting element. The self-light emitting element may have a problem in that the luminance gradually decreases as the time of use thereof increases. The system including the pixel circuit 200 may perform a lifetime compensation function of the pixel circuit by using the light-receiving element PD and the self-light emitting element.

When the self-light emitting element emits light, the light-receiving element PD may receive the light from the self-light emitting element. The system may measure the amount of the light of the self-light emitting element on the basis of the amount of the light received by the light-receiving element PD. The system may compensate the voltage applied to the pixel circuit on the basis of the measured amount of light. Since the voltage is compensated, the self-light emitting element of the pixel circuit can reduce a decrease in luminance according to the time of use.

Figure 8:
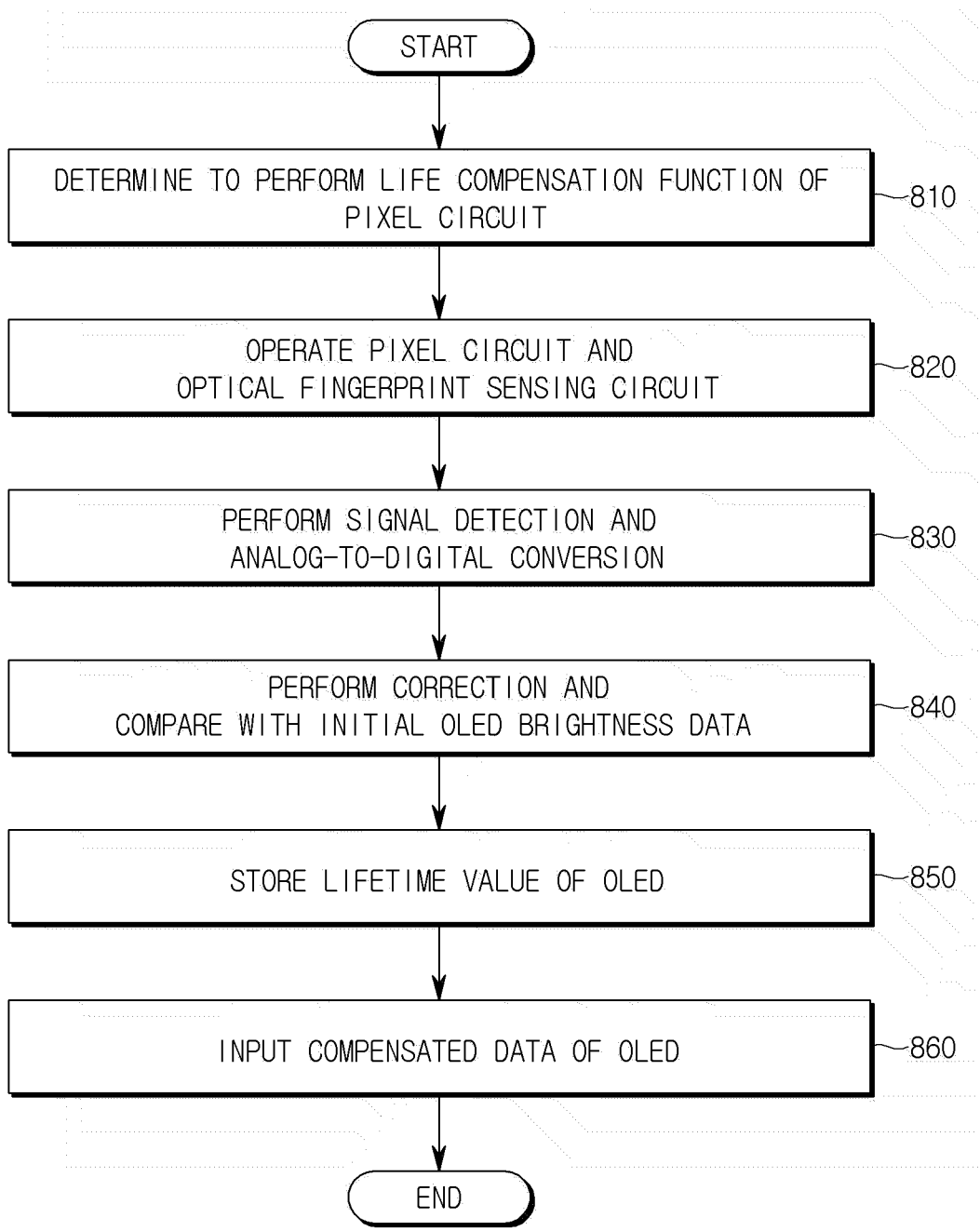
FIG. 8 is a flowchart for describing a lifetime compensation function of the pixel circuit according to the embodiment of the present disclosure.

FIG. 8 is a flowchart for describing the lifetime compensation function of the pixel circuit according to the embodiment of the present disclosure.

Hereinafter, the lifetime compensation function of the pixel circuit will be described in more detail.

The system including the pixel circuit may determining to perform the lifetime compensation function of the self-light emitting element (810). The system may perform operating the pixel circuit and the optical fingerprint sensing circuit (820). The system may perform signal detection and an analog-to-digital conversion (830). The system may perform correcting the conversion result and comparing it with brightness data of the self-light emitting element (840). The system may perform storing a lifetime value of the self-light emitting element (850). The system may perform inputting the compensated data of the self-light emitting element (860).

When the system determines to perform the lifetime compensation function of the self-light emitting element, the system may perform operating the pixel circuit and the optical fingerprint sensing circuit (820). Here, the pixel circuit means a circuit allowing the self-light emitting element to emit light. Also, the optical fingerprint sensing circuit refers to a circuit which is for the purpose that the light-receiving element receives light. According to the embodiment of the present disclosure, the pixel circuit and the optical fingerprint sensing circuit may share at least one transistor or capacitor. However, the present disclosure is not limited thereto. It can be understood by those of ordinary skill in the related art that the system including the pixel circuit and the optical fingerprint sensing circuit which do not share at least one transistor or capacitor is able to perform the lifetime compensation function according to the steps of FIG. 8.

The system may control the self-light emitting element of the pixel circuit to emit light. The light-receiving element PD may generate a current by receiving the light output from the self-light emitting element. Based on the first sensing signal of the first sensing line Sen and the generated current, the fourth transistor 214 may apply a voltage to the third node 223. The voltage applied to the third node 223 may be transmitted to the first node 221 by the source follower operation of the second transistor 212. Based on the second sensing signal of the second sensing line Sen2, the sixth transistor 216 may output the voltage of the first node 221 to the output line OUT. The system may receive the output signal.

The system may perform signal detection and an analog-to-digital conversion (830). Since the received signal will have a voltage or a current value, the system can convert the received signal from analog to digital.

The system may perform correcting the conversion result and comparing it with brightness data of the self-light emitting element (840). The system may correct the digitally converted signal. The system may compare the corrected signal with brightness data stored in advance. The brightness data stored in advance may be data stored during the execution of the previous compensation function. Alternatively, the brightness data stored in advance may be brightness data of a normal operating pixel circuit.

The system may perform storing a lifetime value of the self-light emitting element (850). The lifetime value of the self-light emitting element may represent a time remaining until the amount of light of the self-light emitting element is reduced to a critical amount of light. The system may have data on the change in the amount of light according to the time of use of the self-light emitting element. The system may obtain an expected lifetime based on the amount of light of the current self-light emitting element. Also, the system may store the expected lifetime of the self-light emitting element in the memory.

According to the embodiment of the present disclosure, the system may perform inputting the compensated data of the self-light emitting element (860). For example, the system may transmit a data signal to the pixel circuit 200. The data signal may have a predetermined voltage. The pixel circuit 200 may receive the data signal from the data line. The system may decrease or increase the magnitude of the voltage of the data signal in order to compensate for the amount of light of the self-light emitting element. The pixel circuit may increase the magnitude of the current or voltage to be applied to the self-light emitting element on the basis of the changed data signal. The self-light emitting element may maintain optimal luminance on the basis of the applied current or voltage.

According to another embodiment of the present disclosure, the system may compensate the voltage to be applied to the pixel circuit 200 on the basis of at least one of the comparison result of step 840 or the lifetime value of step 850. The system may compensate a voltage value of at least one of the data signal, the initialization signal, and the power supply VDD. The compensation may mean increasing or decreasing the voltage value. The system compensates the voltage to be applied to the pixel circuit 200, thereby uniformly maintaining the luminance of the self-light emitting element even if time passes.

Embodiment 2

Figure 9:
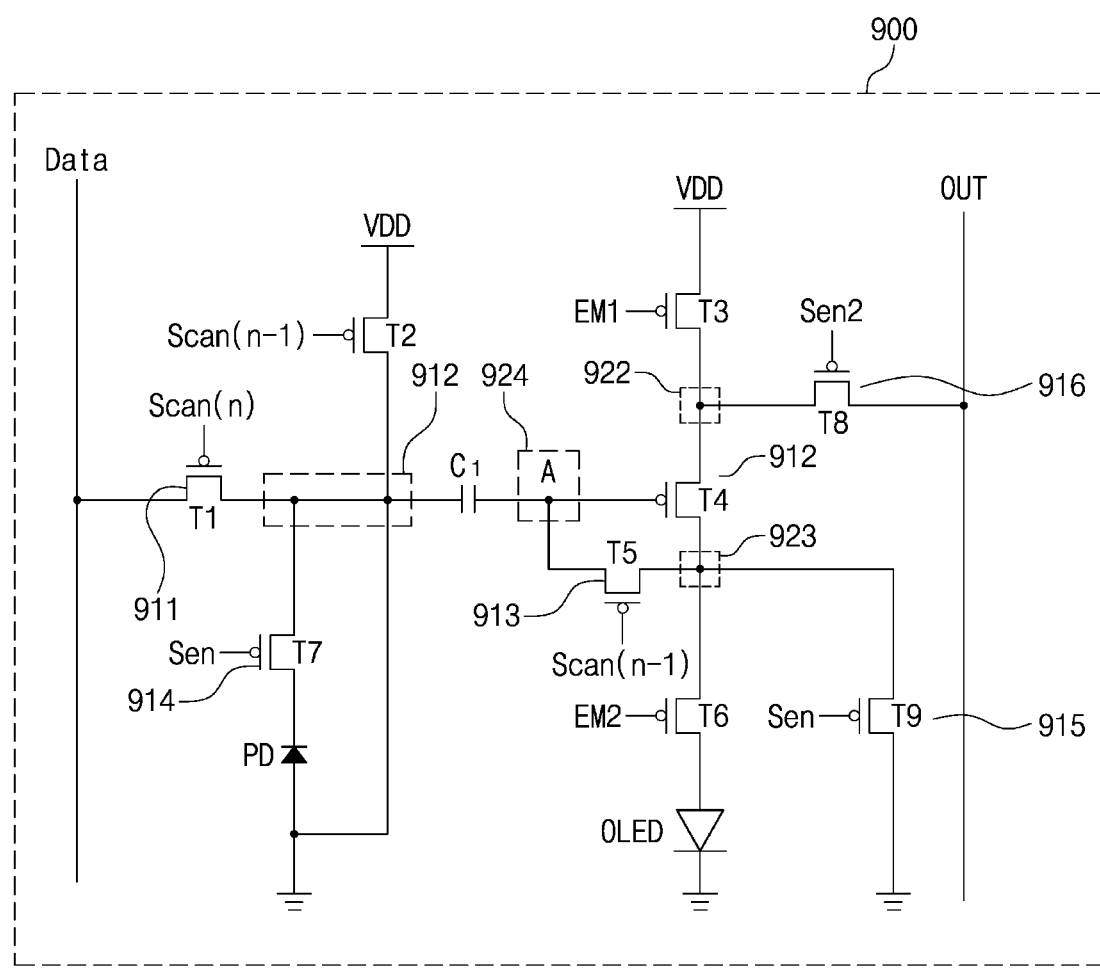
FIG. 9 shows the pixel circuit according to the embodiment of the present disclosure.

FIG. 9 shows the pixel circuit according to the embodiment of the present disclosure.

A pixel circuit 900 including an optical fingerprint sensing circuit has a structure capable of optical fingerprint sensing by sharing a transistor of the pixel circuit within a display panel using internal compensation. A fourth transistor (T7) 914, a fifth transistor (T9) 915, a sixth transistor (T8) 916, and a second capacitor C2 may be added for optical fingerprint sensing.

The pixel circuit 900 including the optical fingerprint sensing circuit may include a first transistor (T1) 911, a second transistors (T4) 912, a third transistor (T5) 913, the fourth transistor (T7) 914, the fifth transistor (T9) 915, the sixth transistor (T8) 916, a first capacitor C1, and the second capacitor C2.

A first terminal of the first transistor 911 may be connected to a data line. A second terminal of the first transistor 911 may be connected to a first node 921. A gate terminal of the first transistor 911 may be connected to an n-th scan line (Scan(n)).

A first terminal of the second transistor 912 may be connected to a second node 922. A second terminal of the second transistor 912 may be connected to a third node 923. A gate terminal of the second transistor 912 may be connected to a fourth node 924.

A first terminal of the third transistor 913 may be connected to the fourth node 924. A second terminal of the third transistor 913 may be connected to the third node 923. A gate terminal of the third transistor 913 may be connected to an (n−1)-th scan line Scan(n−1).

A first terminal of the fourth transistor 914 may be connected to the first node 921. A second terminal of the fourth transistor 914 may be connected to a cathode terminal of a light-receiving element. A gate terminal of the fourth transistor 914 may be connected to a first sensing line Sen.

A first terminal of the fifth transistor 915 may be connected to the third node 923. A second terminal of the fifth transistor 915 may be grounded. A gate terminal of the fifth transistor 915 may be connected to the first sensing line Sen.

A first terminal of the sixth transistor 916 may be connected to the second node 922. A second terminal of the sixth transistor 916 may be connected to an output line OUT. A gate terminal of the sixth transistor 916 may be connected to a second sensing line Sen2.

A first terminal of the first capacitor C1 may be connected to the first node 921. A second terminal of the first capacitor C1 may be connected to the fourth node 924.

A first terminal of the second capacitor C2 may be connected to the first node 921. A second terminal of the second capacitor C2 may be grounded.

The pixel circuit 900 may further include a seventh transistor T2, an eighth transistor T3, a ninth transistor T6, and a self-light emitting element.

A first terminal of the seventh transistor T2 may be connected to a power supply VDD. A second terminal of the seventh transistor T2 may be connected to the first node 921. A gate terminal of the seventh transistor T2 may be connected to the (n−1)-th scan line Scan(n−1).

A first terminal of the eighth transistor T3 may be connected to the power supply VDD. A second terminal of the eighth transistor T3 may be connected to the second node 922. A gate terminal of the eighth transistor T3 may be connected to a first emission line EM1.

A first terminal of the ninth transistor T6 may be connected to the third node 923. A second terminal of the ninth transistor T6 may be connected to an anode terminal of the self-light emitting element. A gate terminal of the ninth transistor T6 may be connected to a second emission line EM2.

A cathode terminal of the self-light emitting element and an anode terminal of the light-receiving element PD may be grounded.

The pixel circuit 900 uses nine transistors and two capacitors. Since the pixel circuit 900 includes the optical fingerprint sensing circuit using a small number of elements, the pixel circuit 900 is able to display images with high resolution and to accurately identify fingerprints.

Embodiment 3

Figure 10:
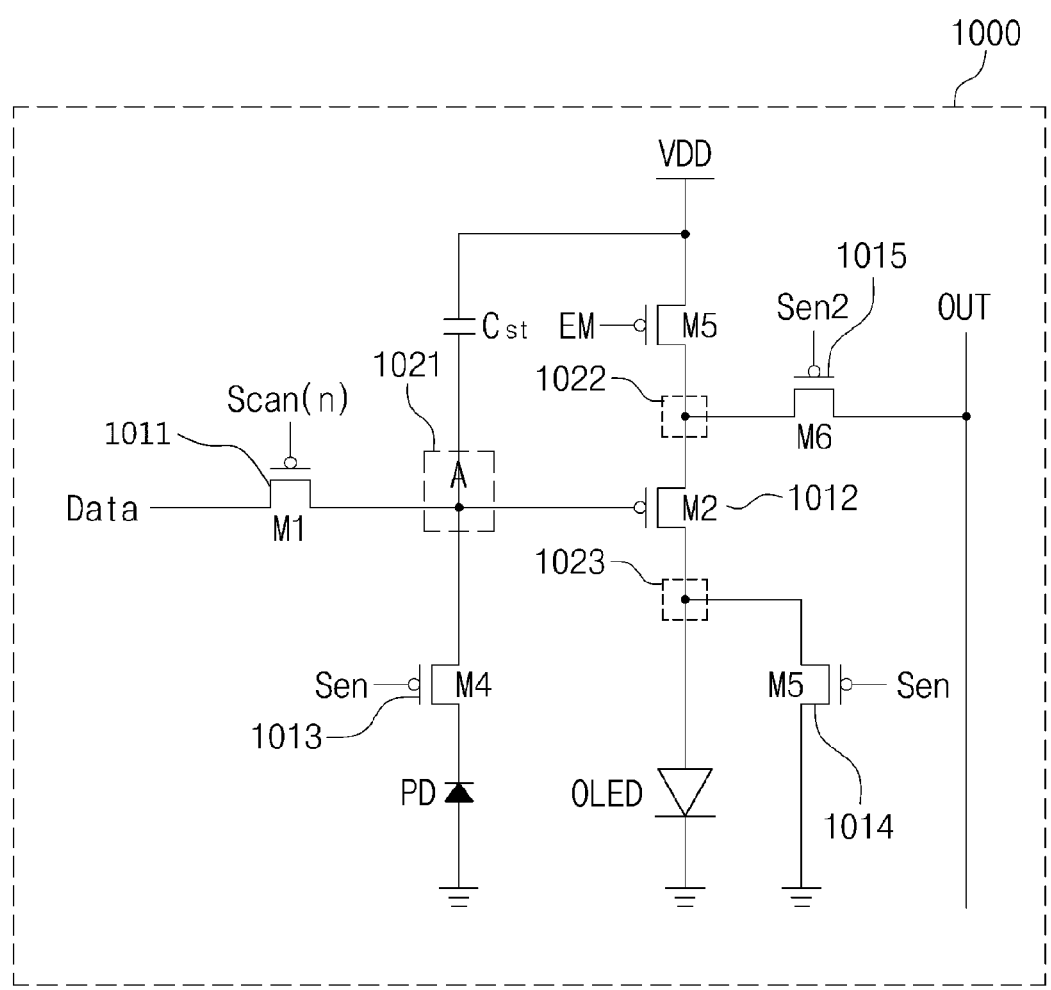
FIG. 10 shows the pixel circuit according to the embodiment of the present disclosure.

FIG. 10 shows the pixel circuit according to the embodiment of the present disclosure.

A pixel circuit 1000 including an optical fingerprint sensing circuit has a structure capable of optical fingerprint sensing by sharing a transistor of the pixel circuit within a display panel using external compensation which is being used in large TV panels. A third transistor (M4) 1013, a fourth transistors (M5) 1014, a fifth transistors (M6) 1015, and a light-receiving element PD may be added for optical fingerprint sensing. When the pixel circuit 1000 is integrated in a mobile panel, the area may be minimized due to the reduction in the number of transistors and the number of signals.

The pixel circuit 1000 including the optical fingerprint sensing circuit may include a first transistor (M1) 1011, a second transistors (M2) 1012, a third transistor (M4) 1013, the fourth transistor (M5) 1014, and the fifth transistor (M6) 1015.

A first terminal of the first transistor 1011 may be connected to a data line Data. A second terminal of the first transistor 1011 may be connected to a first node 1021. A gate terminal of the first transistor 1011 may be connected to an n-th scan line Scan(n).

A first terminal of the second transistor 1012 may be connected to a second node 1022. A second terminal of the second transistor 1012 may be connected to a third node 1023. A gate terminal of the second transistor 1012 may be connected to the first node 1021.

A first terminal of the third transistor 1013 may be connected to the first node 1021. A second terminal of the third transistor 1013 may be connected to a cathode terminal of the light-receiving element PD. A gate terminal of the third transistor 1013 may be connected to a first sensing line Sen.

A first terminal of the fourth transistor 1014 may be connected to the third node 1023. A second terminal of the fourth transistor 1014 may be grounded. A gate terminal of the fourth transistor 1014 may be connected to the first sensing line Sen.

A first terminal of the fifth transistor 1015 may be connected to the second node 1022. A second terminal of the fifth transistor 1015 may be connected to an output line OUT. A gate terminal of the fifth transistor 1015 may be connected to a second sensing line Sen2.

The pixel circuit 1000 may further include a sixth transistor M3, a capacitor CST, and a self-light emitting element.

A first terminal of the sixth transistor M3 may be connected to a power supply VDD. A second terminal of the sixth transistor M3 may be connected to the second node 1022. A gate terminal of the sixth transistor M3 may be connected to an emission line EM.

A first terminal of the capacitor CST may be connected to the power supply VDD. A second terminal of the capacitor CST may be connected to the first node 1021.

An anode terminal of the self-light emitting element may be connected to the third node 1023. A cathode terminal of the self-light emitting element may be grounded. An anode terminal of the light receiving element PD may be grounded.

The pixel circuit 1000 uses six transistors and one capacitor. Since the pixel circuit 1000 includes the optical fingerprint sensing circuit using a small number of elements, the pixel circuit 900 is able to display images with high resolution and to accurately identify fingerprints.

Up to now, various embodiments of the present invention have been described. It can be understood by those skilled in the art that many alternatives, modifications, and variations of the present disclosure can be made without departing from the essential features of the present disclosure. Therefore, the disclosed embodiments are merely exemplary and are not to be construed as limiting the present invention. The scope of the present disclosure is shown in the appended claims and not in the foregoing descriptions. It should be construed that all differences within the scope equivalent to that of the claims are included in the present disclosure.

Meanwhile, the above-described embodiments of the present disclosure can be written as a program that can be executed in a computer, and can be implemented in a general-purpose digital computer that operates the program by using a computer-readable recording medium. The computer-readable recording medium includes a storage medium such as a magnetic storage medium (e.g., ROM, floppy disk, hard disk, etc.), and an optical reading medium (e.g., CD-ROM, DVD, etc.).

What is claimed is:

1. A pixel circuit sharing elements with a finger sensing circuit, the pixel circuit comprising:
   a driving transistor including a first terminal connected to a first node, a second terminal connected to a second node, and a gate terminal connected to a third node, the driving transistor configured to supply a driving current;
   a sensing transistor including a first terminal directly connected to the first terminal of the driving transistor at the first node, and a second terminal connected to an output line of the pixel circuit;
   a first transistor including a first terminal that is connected to a data line, a second terminal that is directly connected to the first terminal of the driving transistor at the first node and directly connected to the first terminal of the sensing transistor at the first node, and a gate terminal of the first transistor connected to a n-th scan line;

a self-light emitting element that displays images by emitting light responsive to the driving current controlled by a driving transistor, the self-light emitting element connected to the second node; and a light-receiving element that receives the light emitted from the self-light emitting element and reflected through a fingerprint of a user and converts the light into an electrical signal, the light-receiving element connected to the gate terminal of the driving transistor at the third node;

wherein the pixel circuit reads, through the output line of the pixel circuit that is connected to the first terminal of the driving transistor at the first node while the sensing transistor is turned on, an output signal generated by the light-receiving element and output to the output line connected to the first terminal of the driving transistor via the driving transistor while the sensing transistor is turned on, and wherein the pixel circuit converts the output signal received from the output line that is connected to the first terminal of the driving transistor while the sensing transistor is turned on from an analog signal into a digital signal, compares the digital signal with initial brightness data of the self-light emitting element prior to deterioration of the self-light emitting element over time, and compensates a voltage to be applied to the driving transistor based on a result of the comparison.

2. The pixel circuit of claim 1, wherein an element that the pixel circuit shares with the fingerprint sensing circuit is any one of the driving transistor, a compensation transistor, or a switch transistor.

3. The pixel circuit of claim 2, wherein the driving transistor drives the self-light emitting element and functions as a buffer that transmits an output voltage of the light-receiving element to the output line of the pixel circuit.

4. The pixel circuit of claim 2, wherein the compensation transistor compensates at least one of a threshold voltage, mobility, and a power supply voltage of the driving transistor.

5. The pixel circuit of claim 2,
wherein the pixel circuit comprises a third transistor functioning as the compensation transistor, a fourth transistor, a fifth transistor, and a sixth transistor, wherein a first terminal of the third transistor is connected to the third node, a second terminal of the third transistor is connected to the second node, and a gate terminal of the third transistor is connected to the n-th scan line, wherein a first terminal of the fourth transistor is connected to the third node, a second terminal of the fourth transistor is connected to a cathode terminal of the light-receiving element, and a gate terminal of the fourth transistor is connected to a first sensing line, wherein a first terminal of the fifth transistor is connected to the second node, a second terminal of the fifth transistor is grounded, and a gate terminal of the fifth transistor is connected to the first sensing line, and wherein a gate terminal of the sensing transistor is connected to a second sensing line.

6. The pixel circuit of claim 5, further comprising a seventh transistor, an eighth transistor, a ninth transistor, a tenth transistor, and a capacitor, wherein a first terminal of the seventh transistor is connected to an initialization line, a second terminal of the seventh transistor is connected to the third node, and a gate terminal of the seventh transistor is connected to an (n−1)-th scan line, wherein a first terminal of the eighth transistor is connected to the initialization line, a second terminal of the eighth transistor is connected to an anode terminal of the self-light emitting element, and a gate terminal of the eighth transistor is connected to the (n−1)-th scan line, wherein a first terminal of the ninth transistor is connected to a power supply, a second terminal of the ninth transistor is connected to the first node, and a gate terminal of the ninth transistor is connected to an emission line, wherein a first terminal of the tenth transistor is connected to the second node, a second terminal of the tenth transistor is connected to the anode terminal of the self-light emitting element, and a gate terminal of the tenth transistor is connected to the emission line, wherein a first terminal of the capacitor is connected to the power supply, and a second terminal of the capacitor is connected to the third node, and wherein a cathode terminal of the self-light emitting element and an anode terminal of the light-receiving element are grounded.

7. The pixel circuit of claim 6,
wherein, based on an (n−1)-th scan signal of the (n−1)-th scan line and an initialization signal of the initialization line, the seventh transistor and the eighth transistor reset a data of a previous frame, wherein, based on an n-th scan signal of the n-th scan line, the first transistor applies a data signal to the first node, and the third transistor compensates a threshold voltage Vth of the driving transistor, wherein, based on a first sensing signal of the first sensing line and a current due to the light-receiving element, the fourth transistor applies a voltage to the third node, wherein the voltage applied to the third node is transmitted to the first node by a source follower operation of the driving transistor, wherein, based on a second sensing signal of the second sensing line, the sixth transistor outputs the voltage of the first node to the output line.

8. The pixel circuit of claim 7,
wherein the light-receiving element:
generates a current by receiving light output from the self-light emitting element,
applies a voltage to the third node on the basis of the first sensing signal of the first sensing line and the generated current, and
transmits the voltage applied to the third node to the first node by the source follower operation of the driving transistor, and wherein, based on the second sensing signal of the second sensing line, the sixth transistor outputs the voltage of the first node to the output line.

* * * * *